(12) United States Patent
Voris et al.

(10) Patent No.: US 10,521,515 B2
(45) Date of Patent: Dec. 31, 2019

(54) OBJECT RECOGNITION FOR 3D PRINTING

(71) Applicant: Disney Enterprises, Inc., Burbank, CA (US)

(72) Inventors: Jeffrey Voris, Pasadena, CA (US); David Crawford, Long Beach, CA (US); Benjamin Christen, Los Angeles, CA (US); Jorge Alted, Altadena, CA (US)

(73) Assignee: Disney Enterprises, Inc., Burbank, CA (US)

( * ) Notice: Subject to any disclaimer, the term of this patent is extended or adjusted under 35 U.S.C. 154(b) by 1522 days.

(21) Appl. No.: 14/460,332

(22) Filed: Aug. 14, 2014

(65) Prior Publication Data

US 2016/0048609 A1 Feb. 18, 2016

(51) Int. Cl.
*G06F 17/50* (2006.01)
*B29C 64/386* (2017.01)
*B33Y 50/02* (2015.01)

(52) U.S. Cl.
CPC ............ *G06F 17/50* (2013.01); *B29C 64/386* (2017.08); *B33Y 50/02* (2014.12)

(58) Field of Classification Search
None
See application file for complete search history.

(56) References Cited

U.S. PATENT DOCUMENTS

| 2011/0161056 A1* | 6/2011 | Mueller | B29C 64/165 703/1 |
| 2014/0125649 A1* | 5/2014 | Carlin | G06T 19/00 345/419 |

* cited by examiner

*Primary Examiner* — Andrew H Lam
(74) *Attorney, Agent, or Firm* — Patent Ingenuity, P.C.; Samuel K. Simpson

(57) ABSTRACT

A process and system scan an object to generate a first 3D digital model of the object. Further, the process and system send data corresponding to the first 3D digital model to a server that is in communication with a database of high quality 3D digital models of a plurality of objects. In addition, the process and system receive a second 3D digital model of the object from the server based upon a matching of the first 3D digital model and the second 3D digital model, the second 3D digital model having a higher resolution of the object than the first 3D digital model. The process and system also print a 3D replica of the object based upon the second 3D digital model.

12 Claims, 6 Drawing Sheets

OBJECT RECOGNITION FOR 3D PRINTING

BACKGROUND

1. Field

This disclosure generally relates to the field of printer configurations. More particularly, the disclosure relates to 3D printer configurations.

2. General Background

Several current 3D printer configurations allow for a 3D printer to be operably connected to an accessory scanner that may be used by a user to scan an object for 3D printing. As an example, an accessory scanner has a turntable on which the object to be scanned is positioned, an image capture device such as a camera, and a plurality of light emitting devices. As the turntable is rotated by the scanner, the image capture device captures images of the object as light from the emitters is reflected from the object and to the camera.

The user scans the object with the scanner, e.g., the user places the object inside of the scanner. The scanner itself or a computing device operably connected to the scanner then generates a 3D digital model of the scanned object. The 3D printer then prints the object based on the 3D digital model.

The 3D digital models generated by the current scanner accessories for 3D printer configurations are typically generated at a low resolution. The typical components of an accessory scanner for a 3D printer, e.g., a turntable, an image capture device, and a plurality of light emitting devices, are generally only capable of generating a low resolution 3D digital model. By utilizing a low resolution 3D digital model, the 3D printer often prints a low quality 3D copy of the object with substantial errors.

Therefore, it is very difficult and expensive to get a high quality, 3D printed copy of a scanned object. An object recognition system that performs object recognition directly or uses the 3D digital model generated by the 3D printer scanner accessory is needed to recognize the object that is being 3D printed, retrieve a high resolution 3D digital model based upon the recognized object, and perform 3D printing based upon the retrieved high resolution 3D digital model.

SUMMARY

A process and system scan an object to generate a first 3D digital model of the object. Further, the process and system send data corresponding to the first 3D digital model to a server that is in communication with a database of 3D digital models of a plurality of objects. In addition, the process and system receive a second 3D digital model of the object from the server based upon a matching of the first 3D digital model and the second 3D digital model, the second 3D digital model having a higher resolution of the object than the first 3D digital model. The process and system also print a 3D replica of the object based upon the second 3D digital model.

A process and system also scan an object to generate scanned data. Further, the process and system send the scanned data to a server that is in communication with a database of 3D digital models of a plurality of objects. In addition, the process and system receive a 3D digital model of the object from the server based upon an object recognition of the object that is determined from the scanned data. The process and system print a 3D replica of the object based upon the 3D digital model.

A process and system also receive object identifier data for an object from a computing device that performs object recognition of the object. The process and system retrieve a 3D digital model of the object from a database of a plurality of 3D digital models of objects based upon the object identifier data. Further, the process and system send the 3D digital model of the object to a 3D printer that prints a 3D replica of the object based upon the 3D digital model.

BRIEF DESCRIPTION OF THE DRAWINGS

The above-mentioned features of the present disclosure will become more apparent with reference to the following description taken in conjunction with the accompanying drawings wherein like reference numerals denote like elements and in which.

DETAILED DESCRIPTION

An object recognition system is provided to recognize an object for 3D printing purposes. By identifying the object to be 3D printed, the object recognition system is able to retrieve a high quality 3D digital model of the object that has been previously stored in a database of high quality 3D digital models. As a result, a user does not have to attempt to scan an object and then obtain a 3D replica based upon a low quality scan of the object. The user scans enough information about the object so that the object can be identified by the object recognition system. After identifying the object, the object recognition system obtains a high quality 3D digital model of the object and sends that high quality 3D digital model to a 3D printer for printing.

The object recognition system allows a user to obtain a more high quality 3D printed replica than those provided by previous configurations that rely on a scanner that is typically only able to generate low resolution 3D digital models. Further, the object recognition system provides a less time consuming process for scanning and 3D printing since the object recognition system relies on obtaining only enough information from the scanner as needed for object recognition purposes rather than previous configurations that relied on obtaining as much information as possible about the object that is being 3D printed from the scanner in an attempt to perform 3D printing based on that information.

Figure 1:
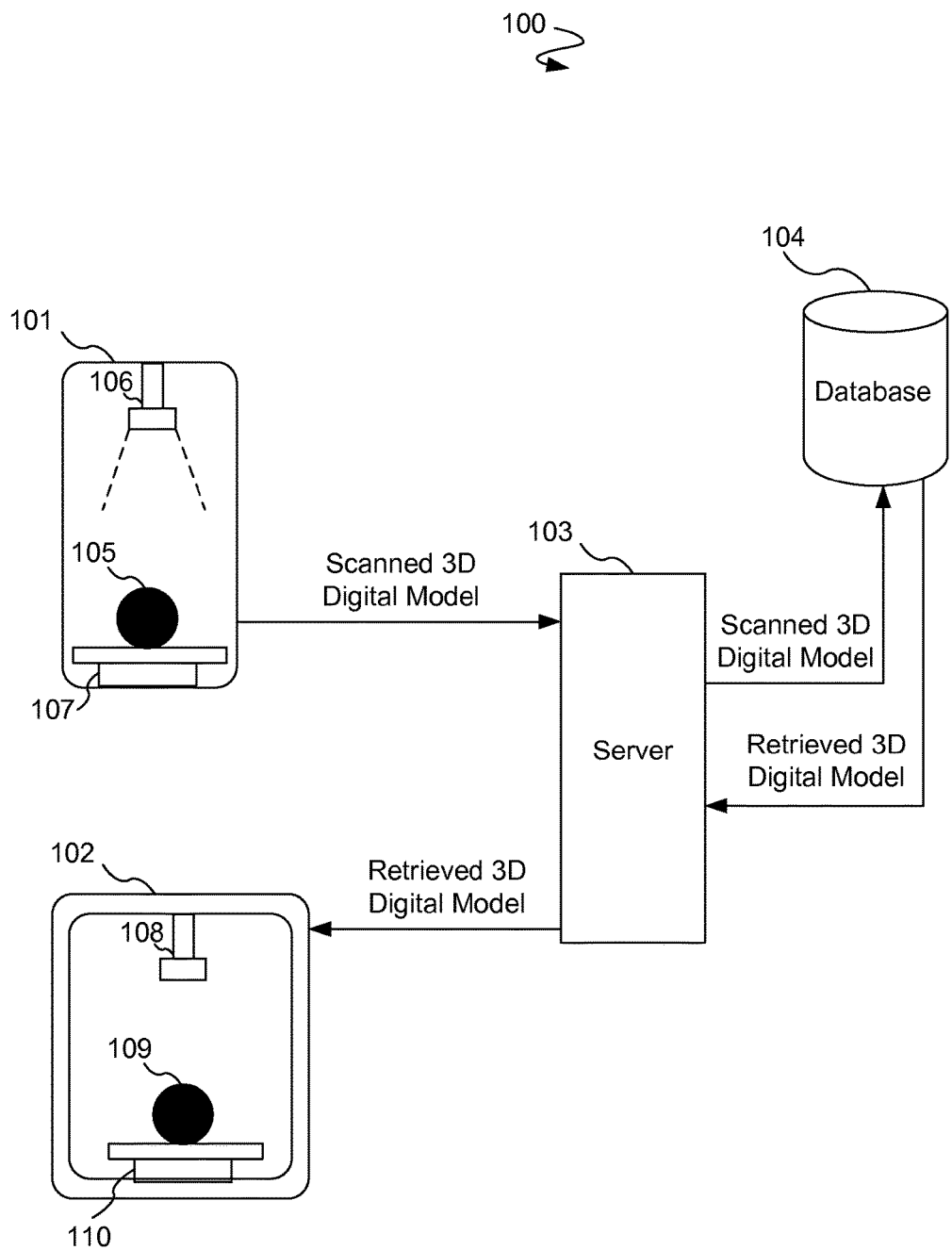
FIG. 1 illustrates an object recognition system.

FIG. 1 illustrates an object recognition system 100. The object recognition system 100 includes a scanner 101, a 3D printer 102, a server 103, and a database 104.

In one implementation, a user places an object 105 that the user wants to replicate in 3D inside of the scanner 101. The scanner 101 may have a turntable 107 or other mechanism for rotating the object 105 to different orientations. During the rotation of the object 105, an image capture device 106, e.g., camera, records images of various features of the object 105. The scanner 101 and/or a computing device in operable communication with the scanner 101 then generates a 3D digital model of the object 105. The scanned 3D digital model includes only enough information as needed to identify distinguishing features of the object 105. In other words, the scanned 3D digital model is not a high resolution scanned model.

In another implementation, a user uses a wand scanner to scan the object 105. Various types of scanner configurations may be used as the scanner 101.

The scanner 101 and/or a computing device in operable communication with the scanner 101 then sends the scanned 3D digital model to a server 103. The server 103 searches a database 104 for a high resolution 3D digital model that was previously stored and that has corresponding identifying features to that of the scanned 3D digital model. After obtaining the retrieved high resolution 3D digital model, the server 103 sends the retrieved high resolution 3D digital model to a 3D printer 102 and/or a computing device in operable communication with the 3D printer 102.

The 3D printer 102 has a fixed build plate 110 on which a material 109 is placed. The 3D printer 102 uses a printer head 108 that is able to send one or more lasers toward the material 109 to print a 3D replica of the object 105. The 3D printer 102 uses the retrieved high resolution 3D digital model as the basis for the replication. The 3D printer 102 can be any 3D printer that is capable of printing high resolution objects from a 3D model.

Figure 2:
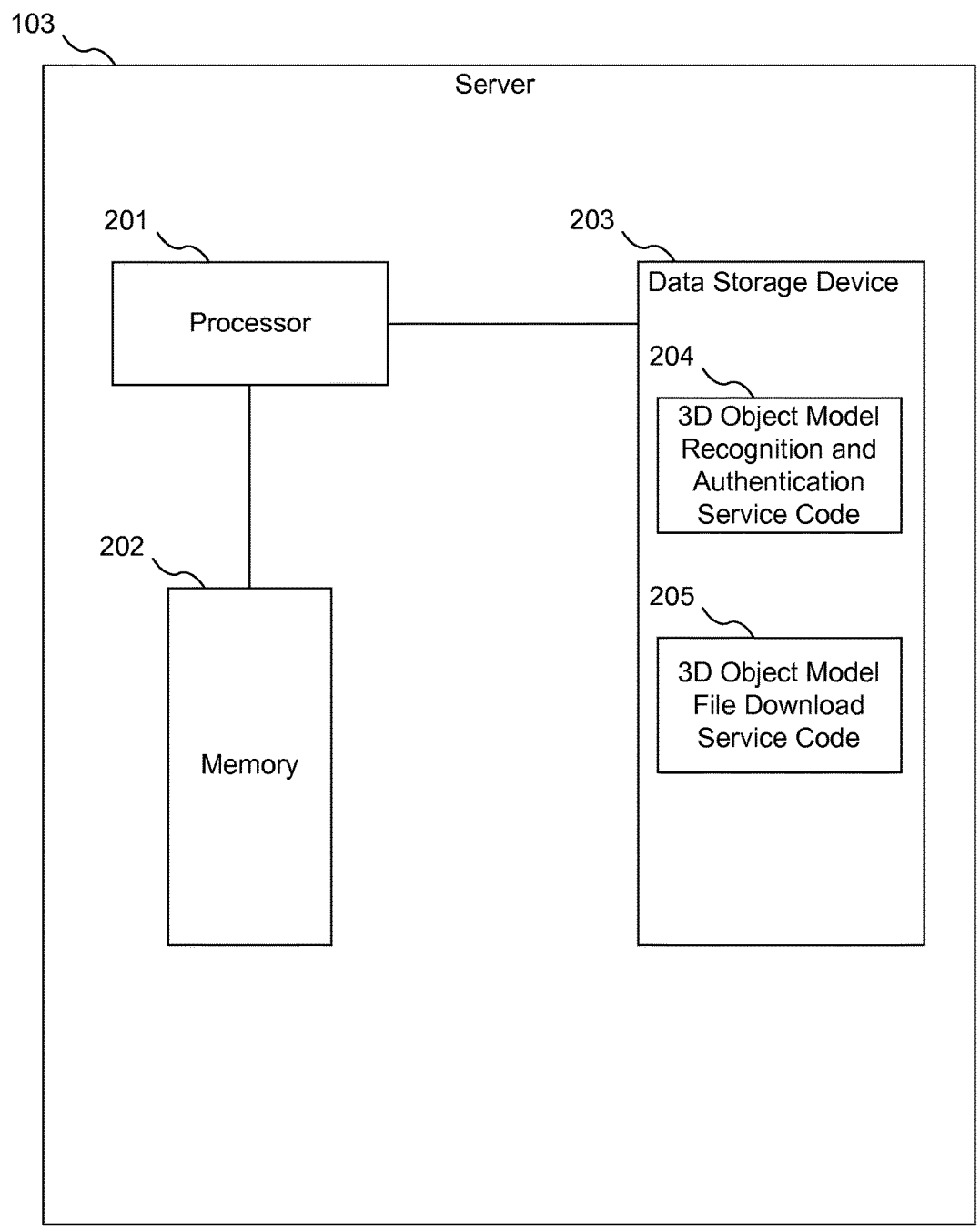
FIG. 2 illustrates the internal components of the server.

FIG. 2 illustrates the internal components of the server 103. The server 103 includes a processor 201, a memory 202, and a data storage device 203. The data storage device 203 includes 3D object recognition and authentication service code 204 in addition to 3D object model file download service code 205.

The server 103 uses the processor 201 to retrieve the 3D object recognition and authentication service code 204 to recognize identifying features of the scanned 3D digital model. For example, the scanned object 105 may have corners in particular locations. The 3D object recognition and authentication service code 204 is used by the processor 201 to retrieve high resolution 3D models from the database 104 based on those identifying features. In one implementation, the 3D object recognition and authentication service code 204 is used by the processor 201 to authenticate which of the retrieved high resolution 3D models most closely resembles the scanned object 105. For instance, the retrieved high resolution 3D models may have some features in common with the scanned object 105. The processor 201 uses the 3D object recognition and authentication service code 204 to determine which of the retrieved high resolution 3D models shares the most common distinguishing features with that of the scanned object 105.

In another implementation, the 3D object recognition and authentication service code 204 uses a criterion that each distinguishing feature determined from the scanned 3D digital model has to be present in the retrieved high resolution 3D digital model. The 3D object recognition and authentication service code 204 attempts to narrow the possible 3D digital models to a single digital model based upon such criterion. If multiple high resolution models are retrieved based upon such criterion, the server 103 requests additional distinguishing features from the scanner 101 and/or a computing device in operable communication with the scanner 101. The scanner 101 may automatically provide such additional data or inform the user that further scanning is necessary to obtain such additional data so that the scanner 101 may send the additional data to the server 103. The 3D object recognition and authentication service code 204 is then used by the processor 201 to further narrow the search results from the database 104. The processor 201 iteratively searches and requests further data as necessary until a single high resolution 3D digital model is obtained.

After determining the high resolution 3D digital model, the processor 201 uses 3D object model file download service code 205 to send the high resolution retrieved 3D digital model to the 3D printer so that the 3D printer 102 replicates the object 105 with the material 109 based upon the high resolution retrieved 3D digital model.

Figure 3:
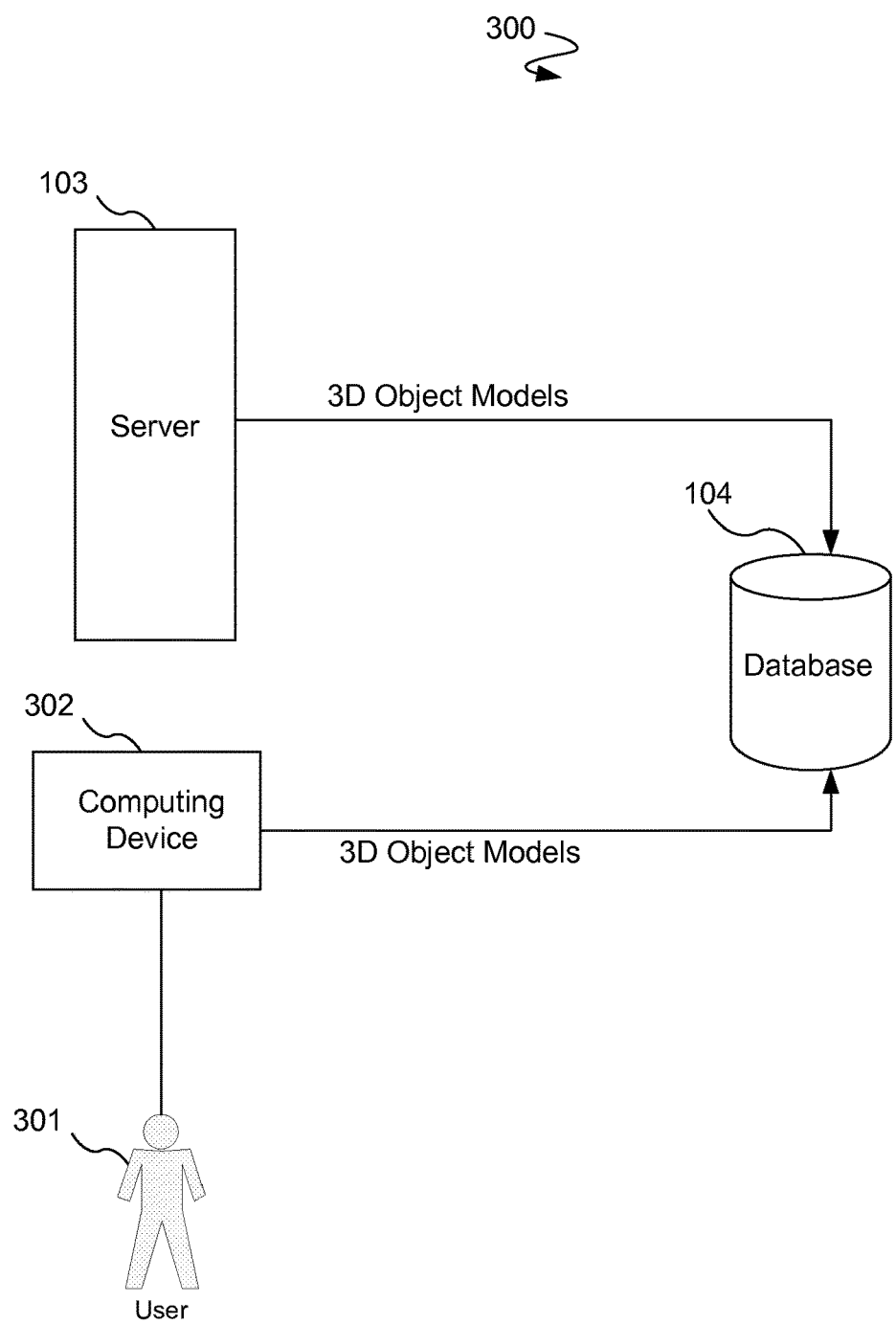
FIG. 3 illustrates a 3D model storage configuration.

FIG. 3 illustrates a 3D model storage configuration 300. The 3D model storage configuration 300 allows a user 301 to use a computing device 302 to store high resolution 3D object models in the database 104 for subsequent retrieval by the server 103 based upon receiving a scanned 3D model. Further, the 3D model storage configuration 300 allows the server 103 to also store high resolution 3D object models in the database 104 for subsequent retrieval by the server 103 based upon receiving a scanned 3D model. Accordingly, a variety of devices may be used to store 3D models prior to retrieval based upon scanning of objects 105 for replication.

Figure 4A:
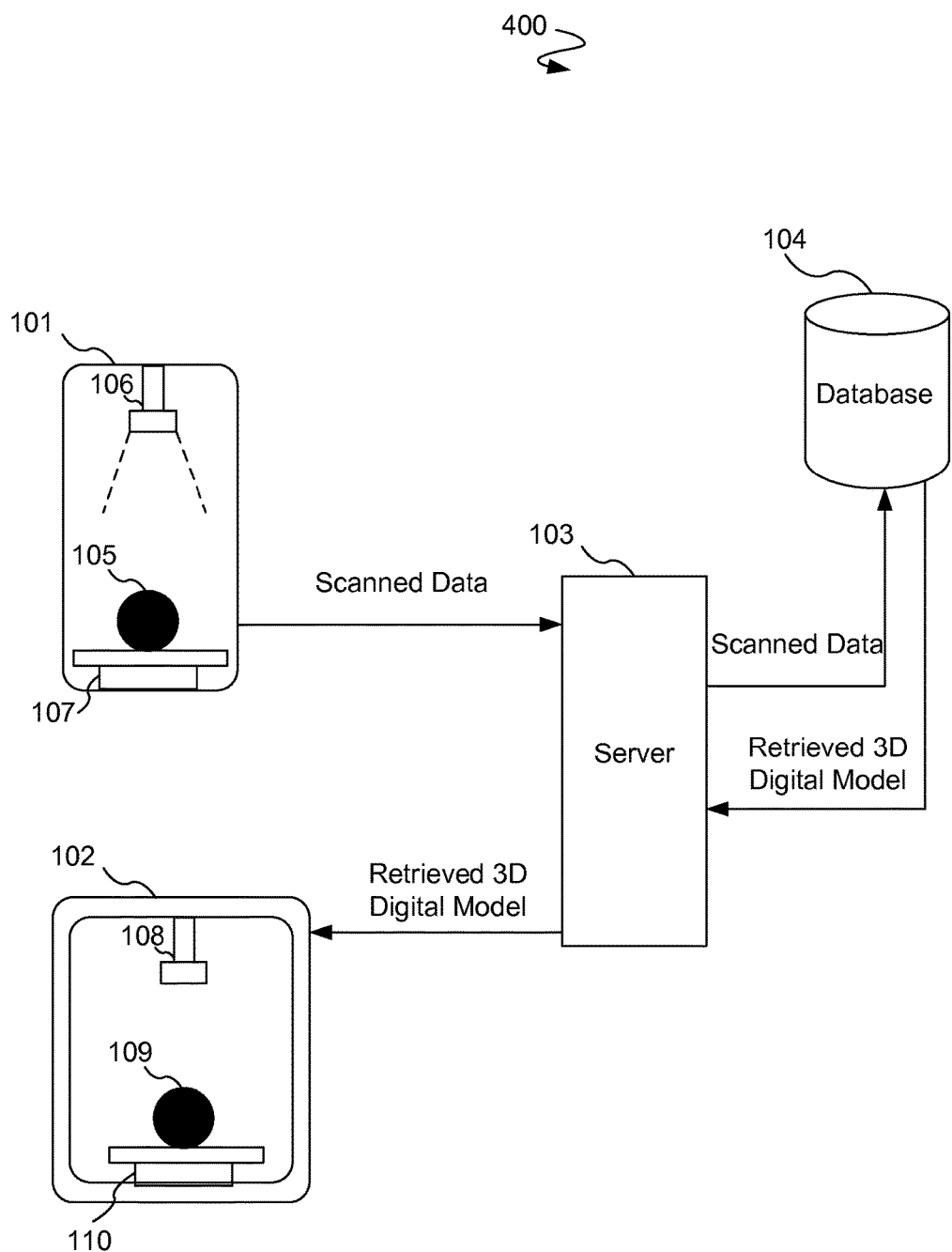
FIG. 4A illustrates an alternative implementation that uses scanned data rather than scanned 3D digital models.

FIG. 4A illustrates an alternative implementation 400 that uses scanned data rather than scanned 3D digital models. The scanner 101 scans data, e.g., distinguishing features of the object 105, rather than a 3D digital model. The scanner 101 then sends the scanned data to the server 103 so that the server 103 searches the database 104 based upon the scanned data. The server 103 then obtains a retrieved 3D digital model based upon the scanned data. Further, the server 103 sends the retrieved 3D digital model to the 3D printer 102 so that the 3D printer replicates the object 105 with the material 109.

Figure 4B:
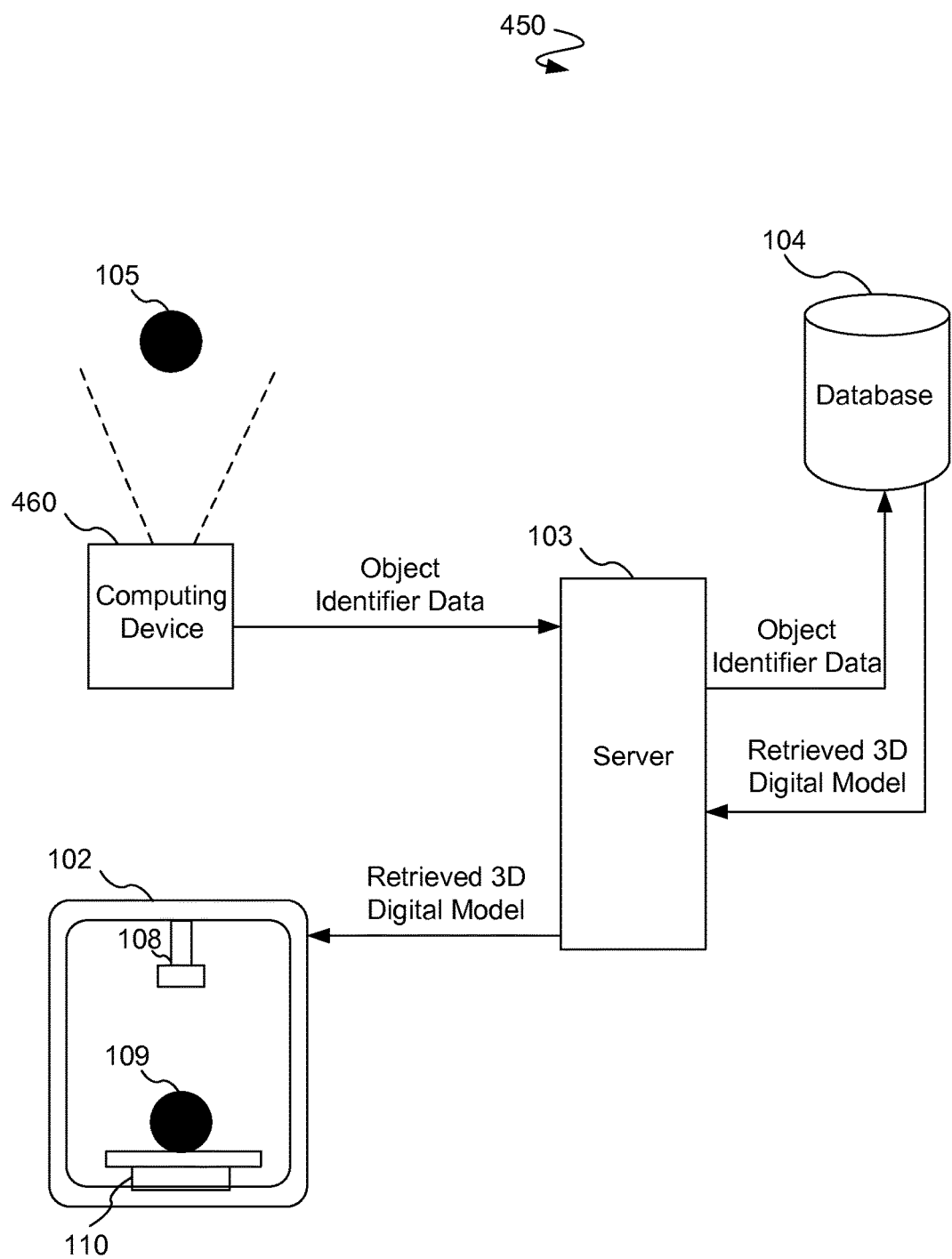
FIG. 4B illustrates yet another alternative implementation that performs direct object recognition of the object.

FIG. 4B illustrates yet another alternative implementation 450 that performs direct object recognition of the object 105. A computing device 460, e.g., smartphone, tablet device, personal computer ("PC"), laptop computer, etc. performs an image capture of the object 105 and then uses object recognition code to identify the object 105. In one implementation, the computing device 450 stores the object recognition code and an object database. The computing device 460 can use a built in or image capture device, e.g., camera, or an image capture device that is in operable communication with the computing device 460. The computing device 460 then performs object recognition according to an object recognition algorithm that matches various features of the object captured in an image with features stored in the object database to find a matching object. In another implementation, the computing device 450 sends the image to an object recognition server that performs the object recognition, retrieves the object identifier from an object database, and sends the object identifier to the computing device 450.

After performing object recognition or requesting an object recognition server to perform the object recognition, the computing device 450 obtains object identifier data for the object. The computing device 450 sends the object identifier data to the server 103. The server sends the object identifier data to the database 104 to retrieve a high quality 3D digital model. The server 103 then sends the retrieved 3D digital model to the 3D printer 102 so that a replica is 3D printed.

Figure 5:
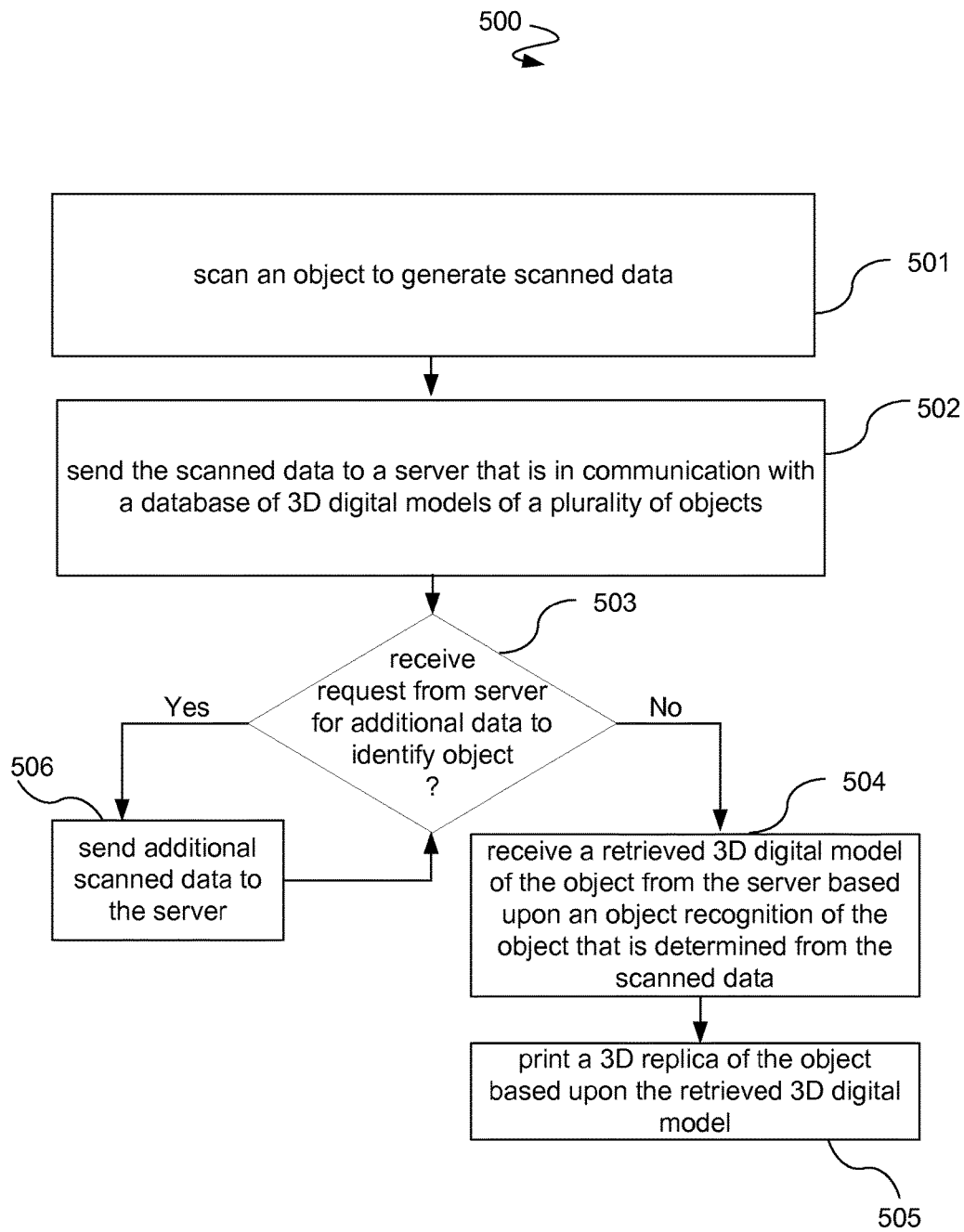
FIG. 5 illustrates a process that is used by the alternative implementation to iteratively obtain scanned data to find a high resolution 3D digital model.

FIG. 5 illustrates a process 500 that is used by the alternative implementation 400 to iteratively obtain scanned data to find a high resolution 3D digital model. At 501, the process 500 scans an object 105 to generate scanned data. Further, at 502, the process 500 sends the scanned data to the server 103 to the database 104. At 503, the process 500 determines whether or not a request has been received from the server 103 for additional data to identify the object 105.

In one implementation, a time threshold is used to determine whether or not a request has or has not been received within a particular time period. If a request has not been received from the server 103, the process 500 proceeds to 504. At 504, a 3D digital model of the object is received from the server 103 based upon an object recognition of the object that is determined from the scanned data. The process 500 then proceeds to 505. At 505, the process 500 prints a 3D replica of the object 105 based upon the retrieved high quality, 3D digital model.

If a request has been received from the server 103 at 503, the server 103 sends additional scanned data to the server 103 at 506. The process 500 then proceeds again to 503 to determine if a further request has been received from the server 103 for additional data to identify the object. Accordingly, the process 500 iteratively sends data and additional data to the server 103 until the server 103 has enough data with distinguishing features to narrow the searched 3D digital models from the database 104 to a single 3D digital model.

Prior to 3D printing the high resolution replica of an object, various processing can be performed. As an example, scaling can be performed to scale the replica of the object to different dimensions than that of the original object that is being replicated. Further, the processing can also include the addition or deletion of certain features such as colors, shapes, etc.

The processes described herein may be implemented in a general, multi-purpose or special purpose processor. Such a processor will execute instructions, either at the assembly, compiled or machine-level, to perform the processes. Those instructions can be written by one of ordinary skill in the art following the description herein and stored or transmitted on a computer readable medium. The instructions may also be created using source code or a computer-aided design tool. A computer readable medium may be any medium capable of carrying those instructions and include a CD-ROM, DVD, magnetic or other optical disc, tape, silicon memory (e.g., removable, non-removable, volatile or non-volatile), packetized or non-packetized data through wireline or wireless transmissions locally or remotely through a network. A computer is herein intended to include any device that has a general, multi-purpose or single purpose processor as described above. For example, a computer may be a personal computer ("PC"), laptop, smartphone, tablet device, set top box, or the like.

It is understood that the apparatuses, systems, computer program products, and processes described herein may also be applied in other types of apparatuses, systems, computer program products, and processes. Those skilled in the art will appreciate that the various adaptations and modifications of the aspects of the apparatuses, systems, computer program products, and processes described herein may be configured without departing from the scope and spirit of the present apparatuses, systems, computer program products, and processes. Therefore, it is to be understood that, within the scope of the appended claims, the present apparatuses, systems, computer program products, and processes may be practiced other than as specifically described herein.

We claim:

1. A method comprising:
    scanning an object to generate a first 3D digital model of the object;
    sending data corresponding to the first 3D digital model to a server that is in communication with a database of 3D digital models of a plurality of objects;
    receiving a second 3D digital model of the object from the server based upon a matching of the first 3D digital model and the second 3D digital model, the second 3D digital model having a higher resolution of the object than the first 3D digital model; and
    printing a 3D replica of the object based upon the second 3D digital model.

2. The method of claim 1, wherein the first 3D digital model and the second 3D digital model are of a different scale.

3. The method of claim 1, wherein the 3D replica is printed without the first 3D digital model.

4. The method of claim 1, further comprising selecting the data corresponding to the first 3D digital model such that the data is only enough information to match the second 3D digital model with the first 3D digital model.

5. The method of claim 4, wherein the data is less than an entirety of the first 3D digital model.

6. A method comprising:
    receiving data corresponding to a first 3D digital model of an object from a scanner that scanned the object;
    identifying a second 3D digital model of the object by matching a distinguishing feature of the data with a distinguishing feature of the second 3D digital model from a database of a plurality of 3D digital models of objects, the second 3D digital model having a higher resolution of the object than the first 3D digital model;
    sending the second 3D digital model of the object to a 3D printer that prints a 3D replica of the object based upon the second 3D digital model.

7. The method of claim 6, wherein the first 3D digital model and the second 3D digital model are of a different scale.

8. The method of claim 6, wherein the 3D replica is printed without the first 3D digital model.

9. The method of claim 6, wherein the data corresponding to the first 3D digital model is selected such that the data is only enough information to match the second 3D digital model with the first 3D digital model.

10. The method of claim 9, wherein the data is less than an entirety of the first 3D digital model.

11. A system comprising:
    a scanner that scans an object to generate a first 3D digital model of the object, sends data corresponding to the first 3D digital model to a server that is in communication with a database of 3D digital models of a plurality of objects, and receives a second 3D digital model of the object from the server based upon a matching of the first 3D digital model and the second 3D digital model, the second 3D digital model having a higher resolution of the object than the first 3D digital model; and
    a 3D printer that prints a 3D replica of the object based upon the second 3D digital model.

12. A system comprising:
    a processor that receives data corresponding to a first 3D digital model of an object from a scanner that scanned the object, identifies a second 3D digital model of the object by matching a distinguishing feature of the data with a distinguishing feature of the second 3D digital model from a database of a plurality of 3D digital models of objects, and sends the second 3D digital model of the object to a 3D printer that prints a 3D replica of the object based upon the second 3D digital model, the second 3D digital model having a higher resolution of the object than the first 3D digital model.

* * * * *